(12) United States Patent
Yuan et al.

(10) Patent No.: US 10,010,009 B2
(45) Date of Patent: Jun. 26, 2018

(54) RACK-MOUNTED DEVICE SYSTEM AND CABLE MANAGEMENT DEVICE/ARM APPLIED TO RACK-MOUNTED DEVICE SYSTEM

(71) Applicant: CELESTICA TECHNOLOGY CONSULTANCY (SHANGHAI) CO. LTD, Shanghai (CN)

(72) Inventors: Ke Yuan, Shanghai (CN); Wenjin Li, Shanghai (CN)

(73) Assignee: CELESTICA TECHNOLOGY CONSULTANCY (SHANGHAI) CO. LTD., Shanghai (CN)

( * ) Notice: Subject to any disclaimer, the term of this patent is extended or adjusted under 35 U.S.C. 154(b) by 0 days. days.

(21) Appl. No.: 15/337,298

(22) Filed: Oct. 28, 2016

(65) Prior Publication Data

US 2018/0035564 A1 Feb. 1, 2018

(30) Foreign Application Priority Data

Jul. 29, 2016 (CN) .................. 2016 1 06142039
Jul. 29, 2016 (CN) .................. 2016 2 08161858 U

(51) Int. Cl.
*H05K 7/14* (2006.01)
*H05K 7/18* (2006.01)

(52) U.S. Cl.
CPC ......... *H05K 7/1491* (2013.01); *H05K 7/1489* (2013.01); *H05K 7/1492* (2013.01); *H05K 7/183* (2013.01)

(58) Field of Classification Search
CPC .. H05K 7/1491; H05K 7/1489; H05K 7/1492; H05K 7/183
See application file for complete search history.

(56) References Cited

U.S. PATENT DOCUMENTS

| | | | |
|---|---|---|---|
| 6,305,556 B1* | 10/2001 | Mayer | G06F 1/18 211/175 |
| 7,009,112 B1* | 3/2006 | Mead | H05K 7/1491 174/69 |
| 7,552,581 B1* | 6/2009 | Pfeifer | F16G 13/16 248/49 |
| 2004/0035995 A1* | 2/2004 | Chen | H05K 7/1491 248/282.1 |
| 2004/0056155 A1* | 3/2004 | Chen | H05K 7/1491 248/49 |
| 2004/0120134 A1* | 6/2004 | Nguyen | H02B 1/202 361/825 |
| 2007/0045479 A1* | 3/2007 | Nguyen | H05K 7/1491 248/49 |
| 2010/0058728 A1* | 3/2010 | Pfeifer | F16G 13/16 59/78.1 |

(Continued)

*Primary Examiner* — Hoa C Nguyen
*Assistant Examiner* — Christopher L Augustin
(74) *Attorney, Agent, or Firm* — Oliff PLC

(57) ABSTRACT

A cable management device/arm is applied to a rack-mounted device system. Cables of a device are managed through a variable-length foldable cable management device/arm. In addition, when an electronic device is fully held in a rack, the cable management device/arm is held at a certain angle in the rack, the interference between the cable management device/arm and a power cable can be prevented from being produced and the length of the cable management device/arm can be flexibly adjusted according to specific application scenarios.

11 Claims, 2 Drawing Sheets

(56) References Cited

U.S. PATENT DOCUMENTS

| | | | |
|---|---|---|---|
| 2010/0123377 A1* | 5/2010 | Hsu | H05K 7/1491 312/330.1 |
| 2011/0100933 A1* | 5/2011 | Kitten | F16L 3/015 211/1 |
| 2012/0134096 A1* | 5/2012 | Zhang | H05K 7/1491 361/679.33 |
| 2016/0061290 A1* | 3/2016 | Hermey | F16G 13/16 59/78.1 |
| 2016/0219748 A1* | 7/2016 | Tsai | H05K 7/1487 |

* cited by examiner

RACK-MOUNTED DEVICE SYSTEM AND CABLE MANAGEMENT DEVICE/ARM APPLIED TO RACK-MOUNTED DEVICE SYSTEM

BACKGROUND OF THE PRESENT INVENTION

Field of Invention

The present invention relates to a rack-mounted device, in particular to a cable management device/arm applied to a rack-mounted device system.

Description of Related Arts

During maintenance of a server or a storage, the server or the storage needs to be pulled out for a certain distance from a rack which is used for replacing hard disk drives. In order to guarantee that the server or the storage is maintained without being powered off, a power cable and a signal line at a rear end need to move together with the server or the storage when the server or the storage is pulled out. In order to guarantee that the cables move smoothly without being interfered, a special cable management system is needed. The existing cable management system needs to occupy a too large space of a rear portion of the rack and often stretches into a power supply module, interference with the power cable on the power supply module is produced, and the length of the existing cable management system is relatively fixed and cannot be flexibly adjusted according to the situation of a machine.

SUMMARY OF THE PRESENT INVENTION

In view of the above-mentioned disadvantages of the prior art, the purpose of the present invention is to provide a rack-mounted device system and a cable management device applied to the rack-mounted device system, so as to solve the problems that interference is produced between the cable management device and the power cable in the prior art, and the length of the cable management device cannot be flexibly adjusted.

In order to realize the above-mentioned purpose and other related purposes, the present invention provides a cable management device, comprising: a structure body comprising a first body end, a second body end and a body holding space for arranging a cable in a penetrating manner, the structure body being capable of being folded at a variable folding angle when being subjected to force applied to the first body end and the second body end; a first fixing piece comprising a first fixing part and a first connecting part connected with the first fixing part, the first connecting part being connected with the first body end; and a second fixing piece comprising a second fixing part and a second connecting part connected with the second fixing part, the second connecting part being connected with the second body end; and the second fixing part and the second connecting part being arranged at a fixed angle.

In one specific embodiment of the present invention, the first connecting part and the first body end are rotatably connected; and the second connecting part and the second body end are rotatably connected.

In one specific embodiment of the present invention, the first fixing part and the first connecting part are rotatably connected.

In one specific embodiment of the present invention, the second fixing part and the second connecting part are of an integrally formed structure.

In one specific embodiment of the present invention, the structure body is folded at a variable folding angle by taking a central portion of the structure body as an axis.

In one specific embodiment of the present invention, the structure body comprises a first arm corresponding to the first body end, a second arm corresponding to the second body end and a rotating part respectively connected with the first arm and the second arm, the first arm and the second arm are rotatably connected through the rotating part, and the first arm, the second arm and the rotating part are internally communicated to form the body holding space.

In one specific embodiment of the present invention, the structure body is a drag chain consisting of a plurality of drag chain units, and the drag chain units from the first body end to the rotating part are connected to form the first arm; the drag chain units from the second body end to the rotating part are connected to form the second arm; each drag chain unit comprises a first unit connecting part and a second unit connecting part connected with another drag chain unit, and a unit holding space is formed between the first unit connecting part and the second unit connecting part, wherein, when the drag chain unit is connected with another drag chain unit, the unit holding space of the drag chain unit is communicated with the unit holding space of another drag chain unit, and a plurality of communicated unit holding spaces form the body holding space; and all drag chain units are rotatably connected.

In one specific embodiment of the present invention, the material of the drag chain is plastic.

In order to realize the above-mentioned purpose and other related purposes, the present invention further provides a rack-mounted device system, comprising: an electronic device, a rack and the cable management device according to any one described above, wherein the rack is provided with a device holding space for holding the electronic device, the electronic device comprises a chassis, the electronic device is held in the device holding space in a withdrawing manner along sidewalls of the rack, and when the electronic device is fully held in the rack, a rear end of the chassis is adjacent to a rear end of the rack; the first fixing part is fixed close to the rear end of the chassis on one sidewall of the chassis; and the second fixing part is fixed corresponding to the first fixing part and close to the rear end of the rack on the sidewalls of the rack, wherein, when the electronic device performs withdrawing movement along the sidewalls of the rack, the structure body is driven by the first connecting part to be folded or extended along a moving direction of the electronic device, and when the electronic device is fully held in the rack, the first fixing part and the second fixing part are adjacently arranged to enable the structure body in a folded state to be held adjacent to the rear end of the chassis in the device holding space.

In one specific embodiment of the present invention, a power cable is held in the rear end of the rack, and when the electronic device is fully held in the rack, the arrangement at a fixed angle enables a gap to be formed between the cable management device and the power cable.

In one specific embodiment of the present invention, the rack further comprises sliding rails, and the electronic device is held in the device holding space in a withdrawing manner through the sliding rails; and the second fixing part is fixed on the sidewalls or the sliding rails of the rack.

In one specific embodiment of the present invention, the first fixing part is fixed on outer sides of the sidewalls of the chassis and the second fixing part is fixed on inner sides of the sidewalls of the rack.

In one specific embodiment of the present invention, the electronic device is a server or a storage.

As described above, according to the rack-mounted device system and the cable management device applied to the rack-mounted device system provided by the invention, the cables of the device are managed through the variable-length foldable cable management device; and in addition, when the electronic device is fully held in the rack, the cable management device is held at a certain angle in the rack, the interference between the cable management device and the power cable can be prevented from being produced and the length of the cable management device can be flexibly adjusted according to specific application scenarios.

DESCRIPTION OF COMPONENT MARK NUMBERS

Figure 1:
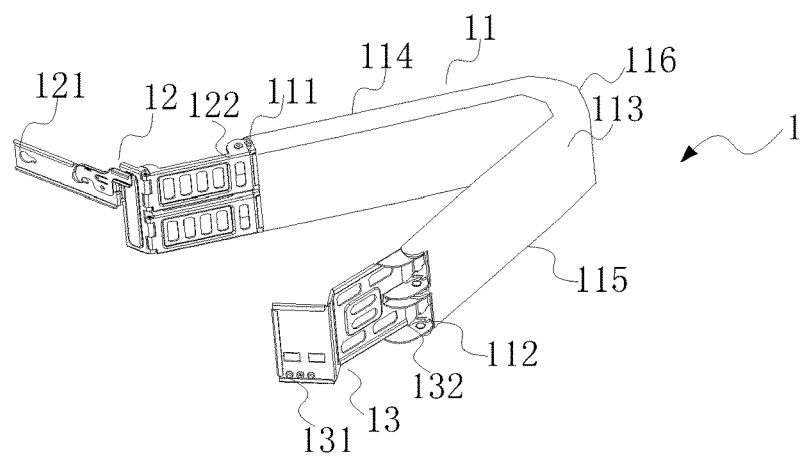
FIG. 1 illustrates a structural schematic view of a cable management device provided by the present invention in one specific embodiment.

1 Cable management device/arm
11 Structure body
111 First body end
112 Second body end
113 Body holding space
114 First arm
115 Second arm
116 Rotating part
12 First fixing piece
121 First fixing part
122 First connecting part
13 Second fixing piece
131 Second fixing part
132 Second connecting part
2 Drag chain unit
21 First unit connecting part
22 Second unit connecting part
23 Unit holding space
3 Rack-mounted device system
31 Electronic device
311 Chassis
3111 Rear end of chassis
3112 Sidewall of chassis
32 Rack
321 Device holding space
322 Sidewall of rack
323 Rear end of rack

DETAILED DESCRIPTION OF THE PREFERRED EMBODIMENTS

The implementation modes of the present invention will be described below through specific embodiments. One skilled in the art can easily understand other advantages and effects of the present invention according to contents disclosed by the description. The present invention may also be implemented or applied through other different specific implementation modes. Various modifications or changes may also be made to all details in the description based on different points of view and applications without departing from the spirit of the present invention. It needs to be stated that the following embodiments and the features in the embodiments may be combined with one another under the situation of no conflict.

It needs to be stated that the drawings provided in the following embodiments are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

Please refer to FIG. 1, which illustrates a structural schematic view of a cable management device provided by the present invention in one specific embodiment. The cable management device 1 is used for managing cable of an electronic device such as a server or a storage, and guaranteeing that the electronic device such as the server or the storage is maintained without being powered off and a power cable and a signal line at a rear end move together with the server or the storage when the electronic device is pulled out, and guaranteeing that the cables move smoothly without being interfered. The cable management device/arm 1 comprises:

a structure body 11 comprising a first body end 111, a second body end 112 and a body holding space 113 for arranging a cable in a penetrating manner, the structure body 11 being capable of being folded at a variable folding angle when being subjected to force applied to the first body end 111 and the second body end 112, wherein, for example, when being subjected to drawing forces in back-to-back directions, the structure body 11 is gradually extended, the folding angle is gradually increased; and when being subjected to compression forces in face-to-face directions, the structure body 11 is gradually compressed and the folding angle is gradually decreased;

a first fixing piece 12 comprising a first fixing part 121 and a first connecting part 122 connected with the first fixing part 121, the first connecting part 122 being connected with the first body end 111; and a second fixing piece 13 comprising a second fixing part 131 and a second connecting part 132 connected with the second fixing part 131, the second connecting part 132 being connected with the second body end 112; and the second fixing part 131 and the second connecting part 132 being arranged at a fixed angle.

In one specific embodiment of the present invention, the first connecting part 122 and the first body end 111 are rotatably connected; and the second connecting part 132 and the second body end a12 are rotatably connected. Preferably, the rotatable connection is in a hinged arrangement.

In one specific embodiment of the present invention, the first fixing part 121 and the first connecting part 122 are rotatably connected. In another specific embodiment, the first fixing part 121 and the first connecting part 122 are of an integrally formed structure, the first fixing part 121 and the first connecting part 122 are arranged at a first fixed angle, the second fixing part 131 and the second connecting part 132 are of an integrally formed structure, and the second fixing part 131 and the second connecting part 132 are arranged at a second fixed angle. In addition, when the cable management device/arm 1 is arranged in a folded state, matching of the first fixed angle and the second fixed angle may enable the cable management device 1 to be arranged at a fixed oblique angle.

In one specific embodiment of the present invention, the structure body 11 is folded at a variable folding angle by taking a central portion of the structure body 11 as an axis. Thereby, the overall width in the folding process can be guaranteed to be the smallest.

In one specific embodiment of the present invention, the structure body 11 comprises a first arm 114 corresponding to the first body end 111, a second arm 115 corresponding to the second body end 112 and a rotating part 116 respectively connected with the first arm 114 and the second arm 115, the first arm 114 and the second arm 115 are rotatably connected through the rotating part 116, and the first arm 114, the second arm 115 and the rotating part 116 are internally communicated to form the body holding space. Shapes of the first arm 114 and the second arm 115 are kept unchanged in a process that the structure body is drawn or compressed.

Figure 2:
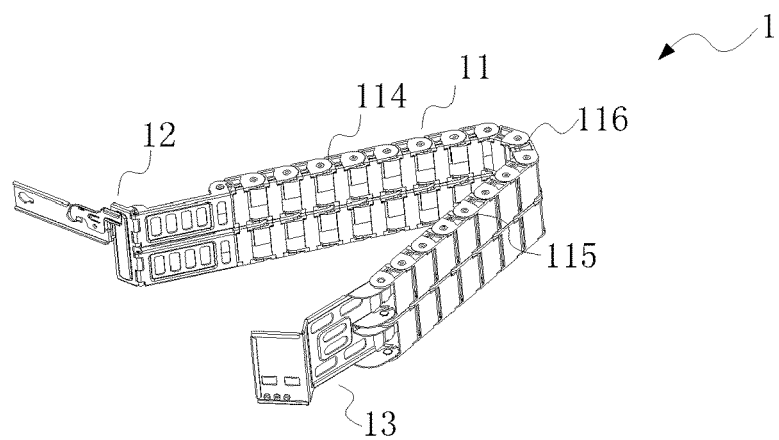
FIG. 2 illustrates a structural schematic view of a structure body applied in one specific embodiment of the present invention.
Figure 3:
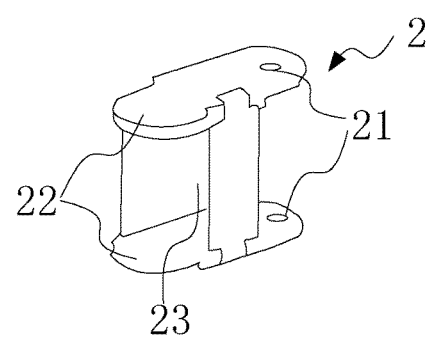
FIG. 3 illustrates a structural schematic view of a drag chain unit in one specific embodiment of the present invention.

In one specific embodiment of the present invention, in combination with FIG. 2 which illustrates a structural schematic view of a structure body in one specific embodiment of the present invention, the structure body in this embodiment is illustrated a drag chain consisting of a plurality of drag chain units 2 as illustrated in FIG. 3. By adjusting a number of the drag chain units 2 forming the drag chain, the length of the drag chain can be conveniently adjusted, so as to satisfy the demand of dragging out the server or the storage from the rack for different distances and the demand of flexibly adapting to sizes of different machine devices. In the aspect of width, in this embodiment, the drag chain consists of two drag chain units 2. Of course, during actual application, the number of the drag chain units 2 in the width direction of the drag chain may be flexibly adjusted according to different device sizes or different requirements on strength of the drag chain. The drag chain units 2 from the first body end 111 to the rotating part 116 are connected to form the first arm 114; the drag chain units 2 from the second body end 112 to the rotating part 116 are connected to form the second arm 115. The rotating part 116 consists of one drag chain unit 2, and by rotatably connecting the drag chain unit 2 forming the rotating part 116 with the drag chain unit 2 arranged on the first arm 114 or the second arm 115, the first arm 114 and the second arm 115 are enabled to be rotatably connected relative to the rotating part 116.

Each drag chain unit 2 comprises a first unit connecting part 21 and a second unit connecting part 22 connected with another drag chain unit, and a unit holding space 23 is formed between the first unit connecting part 21 and the second unit connecting part 22, wherein, when the drag chain unit 2 is connected with another drag chain unit, the unit holding space 23 of the drag chain unit 2 is communicated with the unit holding space of another drag chain unit, and a plurality of communicated unit holding spaces 23 form the body holding space 113; and all drag chain units 2 are rotatably connected.

In one specific embodiment of the present invention, a material of the drag chain is plastic. By adopting the plastic material, the weight is light and the cost is low.

The drag chain structure is just an exemplary structure of the structure body 11, and the structure body 11 may also be other structures which can be used for arranging the cable in a penetrating manner, have controllable shapes and are similar to the drag chain structure, e.g., a hose structure having a controllable shape.

Figure 4:
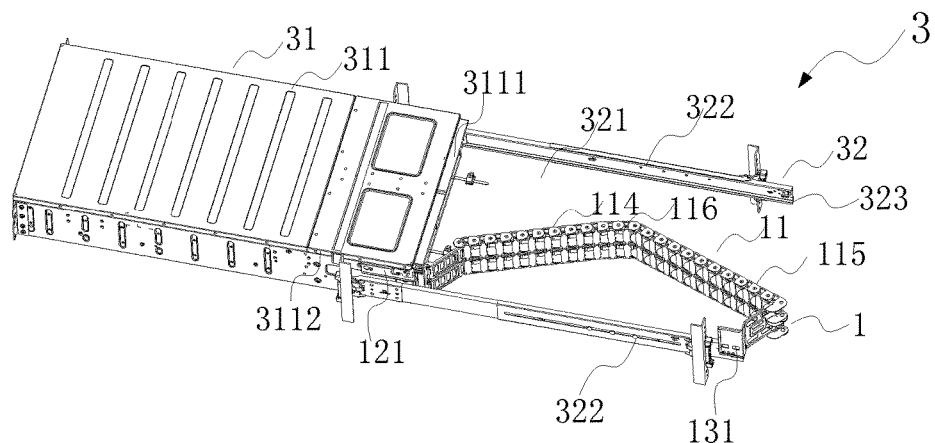
FIG. 4 illustrates a structural schematic view of a rack-mounted device system provided by the present invention in one specific embodiment.

Please refer to FIG. 4 which illustrates a structural schematic view of a rack-mounted device system provided by the present invention in one specific embodiment. The rack-mounted device system 3 comprises an electronic device 31, a rack 32 and the cable management device/arm 1 as illustrated in FIG. 1 or FIG. 2, the rack 32 illustrated in FIG. 4 is used for holding the electronic device 31 and is a part of the cable management device/arm 1. The rack 32 is provided with a device holding space 321 for holding the electronic device 31, preferably, the rack 32 is provided with a plurality of device holding spaces 321 which are arranged in a stacked manner (in this embodiment, only the device holding space 321 for holding the electronic device 31 and the cable management device/arm 1 is illustrated), and the electronic device 31 is preferably a server or a storage. The electronic device 31 comprises a chassis 311, the electronic device 31 is held in the device holding space 321 in a withdrawing manner along sidewalls 322 of the rack 32, and when the electronic device 31 is fully held in the rack 32, a rear end 3111 of the chassis 311 is adjacent to a rear end 323 of the rack 32 (as illustrated in FIG. 5); when the cable management device/arm is installed, the first fixing part 121 is fixed close to the rear end 3111 of the chassis on one sidewall 3112 of the chassis 311; and the second fixing part 131 is fixed corresponding to the first fixing part 121 and close to the rear end 323 of the rack on the sidewalls 322 of the rack 32; and the sidewalls 322 of the rack are adjacent to the sidewalls 3112 of the chassis, i.e., the first fixing part 121 and the second fixing part 131 are located on the same side of the rack-mounted device system 3.

Therein, when the electronic device 31 performs withdrawing movement along the sidewalls 322 of the rack 32, the structure body 11 is driven by the first connecting part 122 to be folded or extended along a moving direction of the electronic device 31, and when the electronic device 31 is fully held in the rack 32, the first fixing part 121 and the second fixing part 131 are adjacently arranged to enable the structure body 11 in a folded state to be held adjacent to the rear end 3111 of the chassis 311 in the device holding space 321. FIG. 4 illustrates a state that most part of the electronic device 31 is located out of the device holding space 321, and at this moment, the cable management device/arm 1 is in an unfolded state.

Figure 5:
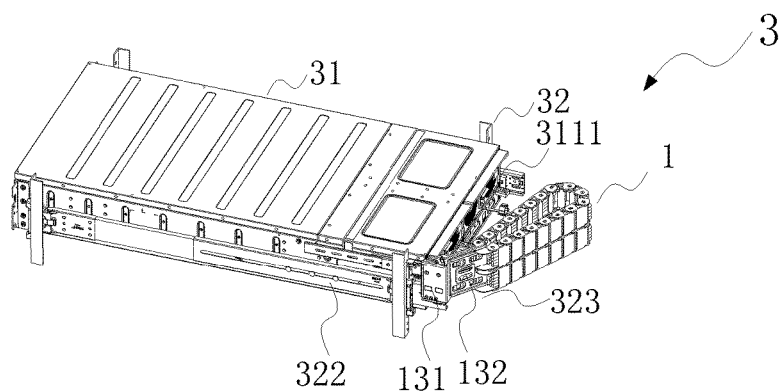
FIG. 5 illustrates a structural schematic view of a rack-mounted device system provided by the present invention in one specific embodiment.

In one specific embodiment of the present invention, in combination with FIG. 5 which illustrates a state that the electronic device 31 is fully held in the rack 32, at this moment, the second fixing part 131 and the second connecting part 132 are arranged at a fixed angle, usually a power cable is held in the rear end 323 of the rack 32, and the arrangement position of the power cable usually corresponds to the positions of the first fixing part 121 and the second fixing part 131, i.e., is located in a larger holding space formed between the cable management device/arm 1 due to oblique arrangement and the rear end 323 of the rack as illustrated in FIG. 5. When the electronic device 31 is fully held in the rack 3, the arrangement at the fixed angle enables a gap to be formed between the cable management device/arm 1 and the power cable, such that the interference between the cable management device/arm 1 and the power cable can be prevented. Preferably, the fixed angle is an obtuse angle.

In one specific embodiment of the present invention, the rack 32 further comprises sliding rails, and the electronic device 31 is held in the device holding space 321 in a withdrawing manner through the sliding rails; and the second fixing part 131 is fixed on the sidewalls 322 or the sliding rails of the rack 32.

In one specific embodiment of the present invention, the first fixing part 121 is fixed on outer sides of the sidewalls 3112 of the chassis and the second fixing part 131 is fixed on inner sides of the sidewalls 322 of the rack 32. The first fixing part 121 may be fixed on the outer sides of the sidewalls 3112 of the chassis 311 through screw connection or fastener connection; and the second fixing part 131 may be fixed on the inner sides of the sidewalls 322 of the rack 32 through screw connection or fastener connection.

To sum up, according to the rack-mounted device system and the cable management device/arm applied to the rack-mounted device system provided by the present invention, the cables of the device are managed through the variable-length foldable cable management device/arm; and in addition, when the electronic device is fully held in the rack, the cable management device/arm is held at a certain angle in the rack, the interference between the cable management device/arm and the power cable can be prevented from being produced and the length of the cable management device/arm can be flexibly adjusted according to specific application scenarios. Therefore, the present invention effectively overcomes various disadvantages in the prior art and thus has a great industrial utilization value.

The above-mentioned embodiments are just used for exemplarily describing the principle and effects of the present invention instead of limiting the present invention. One skilled in the art may make modifications or changes to the above-mentioned embodiments without going against the spirit and the range of the present invention. Therefore, all equivalent modifications or changes made by those who have common knowledge in the art without departing from the spirit and technical concept disclosed by the present invention shall be still covered by the claims of the present invention.

What is claimed is:

1. A cable management device/arm, wherein the cable management device/arm comprises:
    a structure body comprising a first body end, a second body end, a first arm corresponding to the first body end, a second arm corresponding to the second body end, and a rotating part respectively connected with the first arm and the second arm, the first arm and the second arm being rotatably connected through the rotating part, and the first arm, the second arm and the rotating part are internally communicated to form a body holding space for arranging a cable in a penetrating manner, the structure body being capable of being folded at a variable folding angle when being subjected to force applied to the first body end and the second body end, wherein shapes of the first arm and the second arm are kept unchanged during a process whereby the structure body is drawn or compressed;
    a first fixing piece comprising a first fixing part and a first connecting part connected with the first fixing part, the first connecting part being connected with the first body end; and
    a second fixing piece comprising a second fixing part and a second connecting part connected with the second fixing part, the second connecting part being connected with the second body end; and the second fixing part and the second connecting part being arranged at a fixed angle,
    wherein the structure body is a drag chain consisting of a plurality of drag chain units, and the drag chain units from the first body end to the rotating part are connected to form the first arm, the drag chain units from the second body end to the rotating part are connected to form the second arm, and
    wherein each drag chain unit comprises a first unit connecting part and a second unit connecting part connected with another drag chain unit, and a unit holding space is formed between the first unit connecting part and the second unit connecting part, wherein, when the drag chain unit is connected with another drag chain unit, the unit holding space of the drag chain unit is communicated with the unit holding space of another drag chain unit, and a plurality of communicated unit holding spaces form the body holding space, and all drag chain units are rotatably connected.

2. The cable management device/arm according to claim 1, wherein the first connecting part and the first body end are rotatably connected; and the second connecting part and the second body end are rotatably connected.

3. The cable management device/arm according to claim 1, wherein the first fixing part and the first connecting part are rotatably connected.

4. The cable management device/arm according to claim 1, wherein the second fixing part and the second connecting part are of an integrally formed structure.

5. The cable management device/arm according to claim 1, wherein the structure body is folded at a variable folding angle by taking a central portion of the structure body as an axis.

6. The cable management device/arm according to claim 1, wherein the material of the drag chain is plastic.

7. A rack-mounted device system, wherein the rack-mounted device system comprises an electronic device, a rack and the cable management device/arm according to claim 1, the rack is provided with a device holding space for holding the electronic device, the electronic device comprises a chassis, the electronic device is held in the device holding space in a withdrawing manner along sidewalls of the rack, and when the electronic device is fully held in the rack, a rear end of the chassis is adjacent to a rear end of the rack;
    the first fixing part is fixed close to the rear end of the chassis on one sidewall of the chassis; and the second fixing part is fixed corresponding to the first fixing part and close to the rear end of the rack on the sidewalls of the rack,
    wherein, when the electronic device performs withdrawing movement along the sidewalls of the rack, the structure body is driven by the first connecting part to be folded or extended along a moving direction of the electronic device, and when the electronic device is fully held in the rack, the first fixing part and the second fixing part are adjacently arranged to enable the structure body in a folded state to be held adjacent to the rear end of the chassis in the device holding space.

8. The rack-mounted device system according to claim 7, wherein a power cable is held in the rear end of the rack, and when the electronic device is fully held in the rack, the arrangement at a fixed angle enables a gap to be formed between the cable management device/arm and the power cable.

9. The rack-mounted device system according to claim 7, wherein the rack further comprises sliding rails, and the electronic device is held in the device holding space in a withdrawing manner through the sliding rails; and the second fixing part is fixed on the sidewalls or the sliding rails of the rack.

10. The rack-mounted device system according to claim 7, wherein the first fixing part is fixed on outer sides of the sidewalls of the chassis and the second fixing part is fixed on inner sides of the sidewalls of the rack.

11. The rack-mounted device system according to claim 7, wherein the electronic device is a server or a storage.

* * * * *